HIGH FREQUENCY CIRCUIT

Filed Oct. 24, 1960

INVENTOR

Charles J. Weidknecht,

BY Pavie, Haskell and Levine

ATTORNEYS

United States Patent Office 3,195,066
Patented July 13, 1965

3,195,066

HIGH FREQUENCY CIRCUIT

Charles J. Weidknecht, Willow Grove, Pa., assignor, by mesne assignments, to United Aircraft Corporation, a corporation of Delaware Filed Oct. 24, 1960, Ser. No. 64,464
13 Claims. (Cl. 330—23)

This invention relates generally to transistor and solid state electronic transmission circuits and more particularly to such circuits for high frequency signal power amplification and the like and having distributed components such as capacitors and inductors, rather than components in lumped form.

The introduction of the transistor and other solid state devices has permitted great advances to be made in reducing the size, weight and complexity of communication and control electronic circuitry, but the progressively increasing application of electronics for conveying more and different types of data, information and control functions has increasingly required still further reductions in the physical size, weight and capacity of the equipment.

In a prior application of the same inventor, Serial No. 847,814, filed October 21, 1959, there is disclosed a plurality of novel electron tube and transistor circuits that provide increased power handling capacity in smaller and lighter weight circuit packages due to a series of unique circuit configurations that permit improved thermal cooling of the electron tubes and electron valve components. There is also disclosed in said prior application, the physical chassis and component structures for high frequency triode and tetrode vacuum tube circuits that permit these novel circuits to be used at high frequencies and provide considerable reductions in the physical dimensions and weight of the circuit package over known prior art devices.

According to the present invention, there is provided improved high frequency chassis and component structures for transistors and like solid state devices, which structures are smaller in size and lighter in weight than prior art devices and provide improved thermal cooling of the transistors and consequently increase the power handling capabilities. Such high frequency transistor circuit structures are disclosed in both common emitter and common base circuit configurations providing a variety of circuit embodiments adapted for different amplification and impedance coupling requirements.

It is accordingly a principal object of the invention to provide a high frequency power transistor circuit structure of increased power handling capacity for its size and weight.

A still further object is to provide such a circuit of reduced complexity, employing a minimum number of components.

Other objects and many additional advantages will be more readily understood by those skilled in the art after a detailed consideration of the following specification, taken with the accompanying drawings, wherein.

Figure 1:
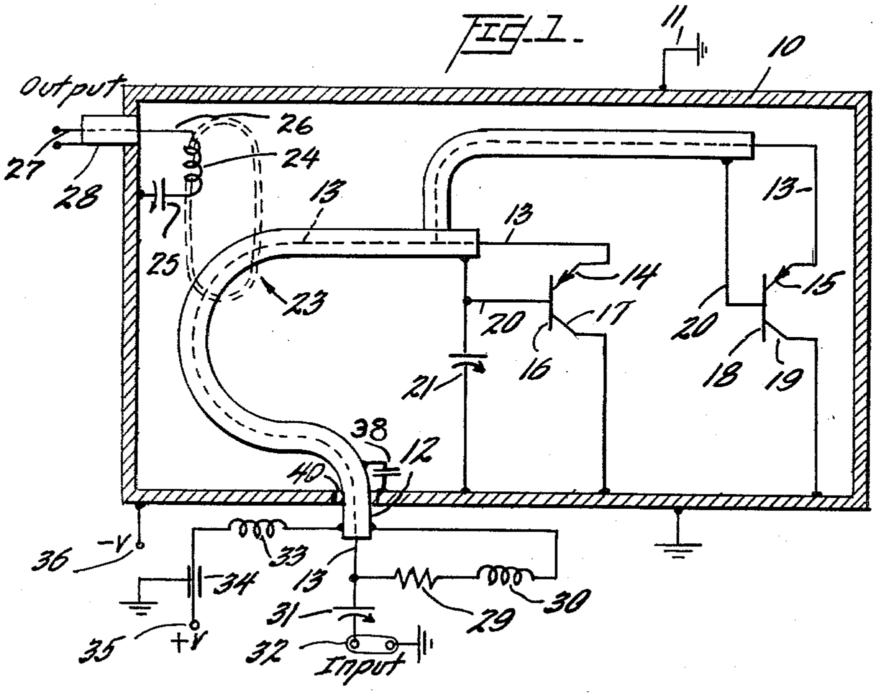
FIG. 1 is a side elevational view, partly in section, and partly schematic, illustrating one preferred transistor circuit structure according to the invention.

Referring now to FIG. 1 there is shown a distributed component transistor circuit structure according to the invention for high frequency power amplification and having considerably improved power handling capacity for its small size and light weight. As shown, the physical embodiment comprises an outer hollow housing 10 of suitable conducting material that substantially completely encloses the transistors and most other circuit components. This outer housing 10 is adapted to be supported by a suitable rack or base plate (not shown) having high thermal and electrical conductivity, which is conventionally represented by the ground symbol and labeled 11, for the purpose of efficiently conveying away the heat produced within and conducted by the housing 10.

Considering the alternating current high frequency signal paths, the input signal is introduced from outside of the housing to the inside thereof by means of a coaxial line 23 or other suitable high frequency transmission means that passes through an opening 40 or insulator in the base wall of the housing 10 without electrically contacting the housing. A high frequency output signal is directed from the inside to outside of the housing 10 through the left-hand side wall thereof by means of a coaxial line or the like having an outer conducting shield 28 that is physically connected to the housing, and an inner conductor 27 leading from inside the container to the outside thereof and being insulated from the shield 28 and container 10.

Within the housing 10, there is provided a pair of transistors or like solid state devices, that are essentially connected in parallel circuit arrangement to increase the power handling capability of the circuit. Each transistor includes a collector electrode, indicated as 17 and 19, respectively, that operates as the power handling electrode of the transistor and passes all current flowing through the transistor. Both power electrodes 17 and 19 are directly connected to the inside surface of the housing 10 to provide a short-circuit for both alternating currents and direct currents thereto, thereby utilizing the housing 10 as a large area heat sink serving to more efficiently remove the heat produced in the transistors and maintain the transistors at their rated operating temperatures. Since these power electrodes 17 and 19 are directly connected to a large area heat sink 10 which may be supported on a rack or other support of high thermal conductivity, these transistors may operate at considerably higher current flow than their rated current capacities, without overheating or otherwise adversely affecting the transistors. Furthermore, since the circuit is cooled by the directed conduction away of the heat as described, rather than primarily by convection or radiation as in prior art devices, the transistor and other circuit components may be placed more closely together to provide a much smaller overall package, since the spacing between the various electrical components according to the present invention is primarily determined by the electrical characteristics of the circuit rather than by thermal considerations as in the prior art devices.

Returning to the circuit of FIG. 1, the high frequency alternating current input signal being directed to the transistors is transmitted between the outer conducting shield 23 of the transmission means and the inner conductor 13, or through the conduit formed inside the shield 23 in the event that the transmission means is in the form of a waveguide. The inner conductor 13 is, in turn, directed in parallel to both emitter electrodes 14 and 15 of the pair of transistors, and the outer shield 23 is electrically connected over lines 20 to the base electrodes 16 and 18, respectively, of the pair of transistors. Thus, the incoming alternating current input signal is directed between the emitter electrode and the base electrode in each transistor. The amplified alternating current output signal is produced between the collector electrodes 17 and 19, and the base electrodes 16 and 18, respectively, and this output signal travels over the tuned circuit comprised of the distributed inductance provided by the partial loop or arcuate shape of the outer shield 23 of the signal transmission means, which distributed inductance is tuned by a variable capacitor 21, connecting the outer shield 23 to the inside surface of the conducting housing 10. The distributed inductance of arcuately shaped shield 23 is in parallel circuit connection with the variable capacitor 21 at the high frequencies involved due to the fact that the lower portion 12 of the shield 23 is coupled to the housing 10 through capacitor 38 and through the distributed capacity being provided by the gap 40, where the shield portion 12 is spaced closely to the base of the housing.

This tuned circuit being provided by the distributed inductance of the shield 23 and the tuning capacitor 21, is inductably coupled to an output winding 24 located within the housing 10, as shown. The output winding 24 is, in turn, tuned by the variable capacity 25 in series therewith and having one terminal grounded to the inside side wall of the housing 10. The other terminal of the output coil 24 is connected over line 26 to the central terminal 27 of the output coaxial line 28 and is, therefore, directed outside of the container to a suitable load (not shown).

Thus, the transistor circuit in FIG. 1 is connected as a common base circuit and having a grounded collector element, with the input signal being directed between the base electrode and the emitter electrode of each transistor and the output alternating current signal being taken from across the base electrode to the collector electrodes, thereof.

Considering the direct current energization of this circuit, the negative terminal 36 of a direct current energizing source (not shown) is connected to the housing 10, and, in turn, is directly coupled to the collector electrodes 17 and 19 of the two transistors. The positive terminal 35 of this direct current source is connected to the outer conducting shield 23 of the signal transmission member through a choke coil 33 which serves to prevent the alternating current signal from passing to the direct current source. It will be observed that the outer shield 23 leads directly to the base electrodes 16 and 18 of the two transistors, whereby the positive terminal of the direct current source is directly connected thereto. This positive terminal 35 of the direct current source is also coupled to both of the emitter electrodes 14 and 15, respectively, from the lower portion 12 of the shield 23 and through a second choke coil 30 and a resistor 29, thereby applying a positive potential to the emitter electrodes. A direct current bias is obtained by rectification of the input signal of the emitter-base junction thereby producing a more negative potential on the emitter than on the base.

Figure 2:
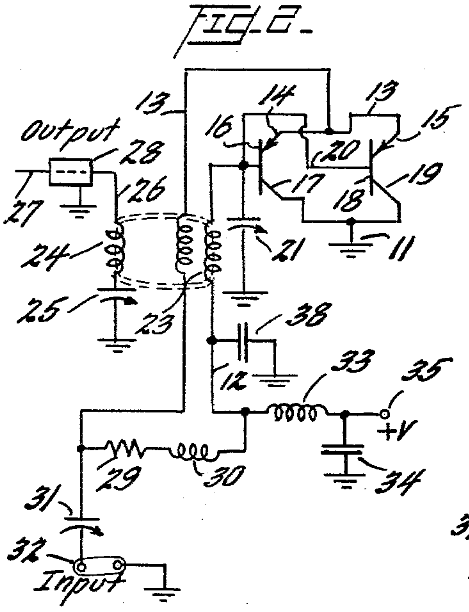
FIG. 2 is an electrical schematic circuit diagram for the circuit structure of FIG. 1.

FIG. 2 illustrates in electrical schematic form the circuit configuration of FIG. 1. In FIG. 2, the circuit components are similarly numbered to correspond with the components of FIG. 1. The arcuately curved portion of the shielded transmission line 23 and its inner conductor 13 are also represented functionally as a pair of bifilar inductance windings, with the outer shield conductor 23 in FIG. 1 being represented as the inductance output winding 23 that is coupled to the output winding 24, and with the inner conductor 13 of the signal transmission means being illustrated as a second winding that is connected in bifilar relation to the winding 23 to prevent feedback between the alternating current input and output circuits.

In contrast to the well known emitter-follower type circuits where the collector electrodes thereof are connected to ground, the present invention provides both an amplitude gain and a power gain between the input and output circuits whereby the circuit functions in the manner of a true amplifier to enhance the amplitude and power of the input signal. This circuit construction also differs physically from the known emitter-follower circuits, since such circuits are connected in a common collector configuration wherein the collector or power electrode is common circuit connection with both the input and the output circuits and consequently cannot produce a gain greater than one. According to the present invention, the circuit configuration shown in FIGS. 1 and 2 are not of the common collector variety but rather of the common base type configuration having the collector element thereof being grounded to dissipate or convey away the heat being generated in the transistor. Consequently, this circuit increases the power handling capabilities of the transistors and permits the construction of a smaller and lighter physical package for the circuit.

Figure 3:
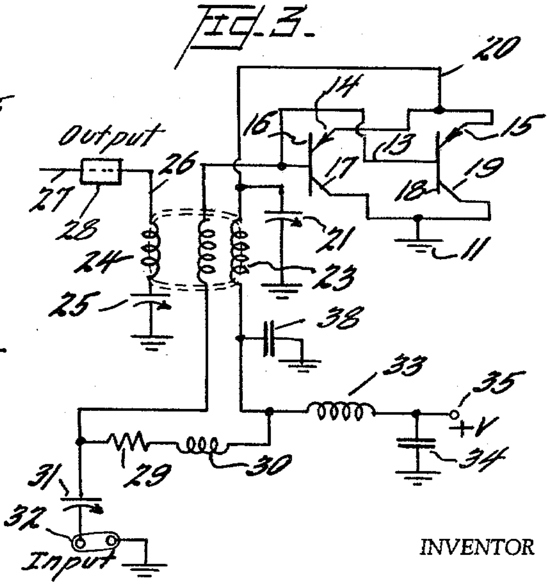
FIG. 3 is an electrical schematic diagram, similar to FIG. 2, and illustrating an alternative embodiment of the invention.

FIG. 3 illustrates an alternative embodiment according to the present invention wherein the transistors are connected in a common emitter type circuit rather than in the common base type circuit as in FIGS. 1 and 2. In common with the embodiments of FIGS. 1 and 2, the collector electrodes 17 and 19 are grounded or short-circuited to the chassis housing 10 as shown and all other circuit components are connected in the same manner as in FIGS. 1 and 2, excepting for the reversed connection to the emitter and base electrodes. Referring specifically to FIG. 3, the only changes necessary to convert the common base type circuit shown in FIGS. 1 and 2 to the common emitter type circuit of FIG. 3 are the reversal of the connections to the base and emitter electrodes of both transistors. Specifically, the input signal line leading from input 32 and through capacitor 31 to line 13 is, in this instance, connected to both of the base electrodes 16 and 18, respectively, of the two transistors whereas the output distributed inductance 23 and tuning capacitor 24 are connected in parallel to the emitter electrodes 14 and 15, as shown. By reversing the connections in this manner, the direct current source positive terminal at line 35 is connected to energize the emitter electrodes 14 and 15 through a choke coil 33. Additionally from the shield 23, the direct current supply is directed through a further choke coil 30 and a resistor 29 to the base electrodes 16 and 18, respectively, and with direct current biasing being obtained by rectification of the input alternating current at the emitter-base junction.

In view of the direct current biasing obtained by rectification of the alternating current input signal at the base-emitter junction, operation of the circuits of FIGS. 1 and 2 as amplifiers may be as Class "A," Class "B," or Class "C" depending upon the power of the input alternating current signals.

In both of the circuit configurations mentioned, many variations may be made in the physical circuitry as described, without departing from the spirit and scope of the invention. For example, the signal transmission means 23 may be in the form of a waveguide wherein the input signal is directed to the transistors through the waveguide, and output signal is taken from the outer shield of the waveguide. Similarly, although two transistors are shown as being connected in parallel, it is evident that the circuit may be employed with only one transistor or with more than two transistors depending upon the power requirements of the circuit. Since these and many other changes may be made without departing from the spirit and scope of the invention, this invention is to be considered as being limited only according to the following claims hereto.

What is claimed is:

1. A high frequency transistor power circuit comprising: an outer hollow container of high electrical and thermal conductivity, a transistor within the container and having a power carrying electrode adapted to pass all current flow through the transistor and at least a second and third electrode, coupling means having high thermal and electrical conductivity providing a short-circuit path between said power electrode and said container for both alternating current and direct current signals, an elongated transmission member having an outer conducting shield having a first end thereof terminating within said container and the second opposite end thereof projecting through an opening in the container without making direct current contact to the container, said transmission member having an arcuately formed portion located inside the container to provide a distributed inductance, means transmitting an input signal inside the transmission member from the second end thereof to the first end thereof and coupling said signal to said second electrode, means coupling the shield of said transmission member to the third electrode near the first end thereof, a tuning capacitor coupling the shield near the first end thereto to the container, an output means within the container inductively coupled to the distributed inductance provided by the arcuately shaped shield of the transmission member and directing an output signal outside the container, and direct current coupling means for applying a direct current potential between said third electrode and said power electrode and a lesser biasing potential between said second electrode and said power electrode, said direct current coupling means including a choke inductance for applying a direct current potential between the shield and said container and including a second choke inductance and an impedance for applying a direct current biasing potential between said container and inner transmission means.

2. In the high frequency power circuit of claim 1, a second transistor coupled in parallel with said transistor with its power carrying collector electrode being short-circuited to said container for both direct current and alternating current signals and its second and third electrodes energized by said signal transmission member in the same manner as said first mentioned transistor.

3. In the cirucit of claim 1, said second electrode being a base electrode, said third electrode being an emitter electrode, and said power electrode being a collector electrode.

4. In the circuit of claim 1, said second electrode being an emitter electrode, said third electrode being a base electrode and said power electrode being a collector electrode.

5. In a miniaturized radio frequency power handling circuit, a hollow container of high electrical and thermal conductivity, a transistor within said container, said transistor having a power handling electrode and having two other electrodes, means directly connecting said power handling electrode to the container for grounding the power electrode thereto for both radio frequency energization and direct current energization, a pair of noninductively coupled conductors, said conductors each projecting into said container without direct contact with the container and being of sufficient length to provide a distributed inductance, one of said conductors having one terminal connected with one of said other electrodes inside the container and its other terminal accessible outside the container, and the other conductor having one terminal connected with the other of said electrodes inside the container and its other terminal accessible outside the container, circuit means external of said container for applying radio frequency and direct current energization between one of said conductors and the container, and applying direct current energization between the other conductor and the container, capacitor means for short circuiting said other conductor to said container for radio frequency signals at a position close to where said other conductor enters said container, capacitor means within the container and in circuit with said other conductor for tuning the distributed inductance of said other conductor, and a tank circuit inductively coupled to said other conductor for obtaining an output signal.

6. In the circuit of claim 5, a plurality of transistors within said container, each having at least three electrodes including a power electrode and other electrodes, the power electrodes of all transistors being connected to the container to provide a short circuit thereto for both radio frequency signals and direct current energization, and said other electrodes of each transistor being connected in parallel to said first mentioned transistor.

7. A high frequency transistor circuit of increased power handling capacity and miniature size comprising:

a hollow container of high electrical and thermal conductivity, a transistor within said container having a collector, emitter, and base electrodes, said collector electrode being short circuited to said container for both direct current and radio frequency signals, a pair of non-inductively coupled conductors inside the container and having portions exteriorly accessible of the container, said conductors having distributed inductance at the high frequency operation of the circuit, one of said conductors having one terminal thereof electrically interconnected with the base and the other conductor having one terminal electrically interconnected with the emitter, means external of the container for applying a radio frequency input signal and a direct current energization between the other terminal of one of said conductors and the container, and means external of the container for applying a direct current energization between the other terminal of the remaining one of the conductors and the container, an adjustable capacitor coupled to one of said conductors inside the container for tuning the distributed inductance of that conductor, and a tank circuit inductively coupled to said tuned distributed inductance for obtaining an output radio frequency signal from the circuit.

8. In the transistor power circuit of claim 7, said conductors comprising the inner and outer conductors of a coaxial transmission line.

9. In the transistor circuit of claim 7, a plurality of like transistors within the container with their electrodes interconnected in parallel.

10. A high frequency, high power transistor circuit of miniature size comprising:

a small hollow container of high electrical and thermal conductivity, a plurality of transistors within said housing, each having collector, emitter, and base electrodes, with the corresponding electrodes of each transistor connected in parallel, a short section of curved transmission line within said container and having one end proximate said transistors and the other end thereof electrically accessible exteriorly of said container, said transmission line having a distributed inductance at the high frequency, said transmission line having a pair of noninductively coupled conductors, at the end of said transmission line proximate said transistors, one of said conductors being electrically connected to the base electrodes and the other conductor to the emitter electrodes of said transistors, means directly connecting said collector electrodes of the transistors to the inside of the container, coupling means exterior of said container for applying a radio frequency input signal and a direct current biasing potential between one of said conductors and said container and applying a direct current potential to said other conductor, means interiorly of said container for tuning the distributed inductance of said other conductor, and a tank circuit including an inductance within said container and inductively coupled with said tuned distributed inductance for obtaining a radio frequency output signal from said circuit.

11. A high frequency transistor circuit of increased power handling capacity and miniature size comprising:
a hollow container of high electrical and thermal conductivity,
a transistor within the container and having a collector, emitter, and base electrodes,
said collector electrode being directly connected to the container for both electrical and thermal conduction therebetween,
a coaxial transmission line within said container having an inner and outer conductors, said line being arcuately configured along its length,
at one end of said line, said inner conductor being coupled to one of said base and emitter electrodes and said outer conductor being coupled to the other one of the base and emitter electrodes,
at the other end of said line the inner conductor being electrically accessible outside said container,
capacitor means for coupling the outside conductor to said container at a position near the other end thereof,
means for applying a high frequency input signal between the inner and outer conductors,
means for applying a direct current energization between the outer conductor and said container,
means for providing a direct current biasing means between said inner and outer conductors,
and output means within said container coupled to said outer conductor and to said container for obtaining a high frequency output signal.

12. A high frequency transistor circuit of increased power handling capacity and miniature size comprising:
a heat sink of high electrical and thermal conductivity,
a transistor having a collector, emitter, and base electrodes,
means interconnecting the collector to the heat sink for both electrical and thermal conductivity therebetween,
a coaxial transmission line having inner and outer conductors, said line being arcuately configured along its length,
means interconnecting the inner conductor to one of said base and emitter electrodes and connecting said outer conductors to the other one of the base and emitter electrodes near one end of said line, means for applying a high frequency input signal between the inner conductor and the heat sink at a position near the other end of the line,
capacitor means for coupling the outer conductor to the heat sink near said other end of the line,
means coupled to said outer conductor at a location intermediate the ends of the line and to said heat sink to obtain a high frequency output signal from between said outer conductor and heat sink,
whereby said heat sink serves as a common ground connection between said input and output signals.

13. A high frequency transistor circuit of increased power handling capacity and miniature size comprising:
a hollow container of high electrical and thermal conductivity,
a transistor within the container and having a collector, emitter, and base electrodes,
said collector electrode being directly connected to the container for both electrical and thermal conduction therebetween,
a coaxial transmission line within said container having an inner and outer conductors, said line being arcuately configured along its length,
at one end of said line, said inner and outer conductors being coupled to the base and emitter electrodes, with the inner conductor being coupled to one of the base and emitter electrodes and the outer conductor being coupled to the other one of the base and emitter electrodes,
at the other end of said line the inner conductor being electrically accessible outside said container,
means for applying a high frequency input signal between the inner and outer conductors,
means for applying a direct current energization between the outer conductor and said container,
means for providing a direct current biasing means between said inner and outer conductors,
and output means within said container coupled to said outer conductor and to said container for obtaining a high frequency output signal.

References Cited by the Examiner

UNITED STATES PATENTS 2,784,262 3/57 Crow.

ROY LAKE, *Primary Examiner.*

BENNETT G. MILLER, NATHAN KAUFMAN, *Examiners.*